(12) United States Patent
Ma et al.

(10) Patent No.: US 10,134,124 B2
(45) Date of Patent: Nov. 20, 2018

(54) REFERENCE IMAGE CONTOUR GENERATION

(71) Applicant: Dongfang Jingyuan Electron Limited, Beijing (CN)

(72) Inventors: Weimin Ma, Beijing (CN); Zongqiang Yu, Beijing (CN)

(73) Assignee: Dongfang Jingyuan Electron Limited, Beijing (CN)

( * ) Notice: Subject to any disclaimer, the term of this patent is extended or adjusted under 35 U.S.C. 154(b) by 206 days.

(21) Appl. No.: 15/285,925

(22) Filed: Oct. 5, 2016

(65) Prior Publication Data

US 2018/0053291 A1   Feb. 22, 2018

Related U.S. Application Data

(63) Continuation of application No. PCT/CN2016/097167, filed on Aug. 29, 2016.

(30) Foreign Application Priority Data

Aug. 18, 2016   (CN) .......................... 2016 1 0687770

(51) Int. Cl.
  *G06T 7/00*   (2017.01)
  *G03F 7/00*   (2006.01)

(52) U.S. Cl.
  CPC ............... *G06T 7/001* (2013.01); *G03F 7/00* (2013.01); *G06T 7/0085* (2013.01); *G06T 2207/30148* (2013.01)

(58) Field of Classification Search
  CPC ................... G06T 7/001; G06T 7/0085; G06T 2207/30148
  See application file for complete search history.

(56) References Cited

U.S. PATENT DOCUMENTS

| 2003/0223631 | A1  | 12/2003 | Ine |
| 2011/0161893 | A1* | 6/2011  | Lin .......................... G03F 1/72  716/52 |
| 2015/0228063 | A1* | 8/2015  | Minakawa ............ H01J 37/244  382/151 |
| 2016/0300338 | A1* | 10/2016 | Zafar ...................... G06T 7/001 |

FOREIGN PATENT DOCUMENTS

| CN | 1869667 A   | 11/2006 |
| CN | 103617627 A | 3/2014  |
| CN | 104718428 A | 6/2015  |

* cited by examiner

*Primary Examiner* — Phuoc Tran
(74) *Attorney, Agent, or Firm* — Young Basile Hanlon & MacFarlane, P.C.

(57) ABSTRACT

A method for reference image contour generation includes generating a mask pattern based on design target information, generating a reference image based on a simulation of photolithographic effects on the mask pattern, generating a reference image contour pattern based on edge detection in the reference image, and generating a scanned image contour pattern as a function of the reference image contour pattern and a scanned image of an integrated circuit.

18 Claims, 10 Drawing Sheets

REFERENCE IMAGE CONTOUR GENERATION

CROSS REFERENCE TO RELATED APPLICATION(S)

This application claims priority to Chinese application No. 201610687770.7, filed on Aug. 18, 2016, and is a continuation of International patent application No. PCT/CN2016/097167, filed on Aug. 29, 2016, the contents of both of which are incorporated herein by reference in their entireties.

TECHNICAL FIELD

This disclosure relates to inspection of integrated circuits fabricated on wafers, and more specifically, to generating reference image contour for defect inspection.

BACKGROUND

Manufacture of microchip devices continually strives for smaller sized elements for higher density integrated circuit design on a target wafer. For example, demand for 20 nm resolution now exists for features of logic circuits and arrays in microchip fabrication. Wafer inspection systems can detect defects that occur during the manufacturing process. Inspection and metrology of wafer dies may utilize a scanning device such as a scanning electron-beam microscope (SEM) to generate die images for die-to-die comparisons based on measurements of die features. However, images from the scanning device may include noise that can interfere with accurate determination of contour lines for the die features from which measurements are taken. Extraction of feature edges is unreliable for determination of the contour lines, as there may be false contour lines identified due to noise.

SUMMARY

This application relates to inspection of integrated circuits fabricated on wafers. Disclosed herein are aspects of systems, methods and apparatuses for reference image contour generation for use with scanned images of a wafer inspection.

One aspect of the disclosure is a method for reference image contour generation. The method may include generating a mask pattern based on design target information, generating a reference image based on a simulation of photolithographic effects on the mask pattern, generating a reference image contour pattern based on edge detection in the reference image, and generating a scanned image contour pattern as a function of the reference image contour pattern and a scanned image of an integrated circuit.

Another aspect of the disclosure is a method for reference image contour generation, including generating a mask pattern based on design target information, generating a reference image based on a simulation of photoresist effects on the mask pattern, generating a reference image contour pattern based on edge detection in the reference image, and generating the scanned image contour pattern as a function of the reference image contour pattern and a scanned image of an integrated circuit.

Another aspect of the disclosure is an apparatus that includes a memory and a processor configured to execute instructions stored in the memory to generate a mask pattern based on design target information, generate a reference image based on a simulation of photolithographic effects on the mask pattern, generate a reference image contour pattern based on edge detection in the reference image, and generate a scanned image contour pattern as a function of the reference image contour pattern and a scanned image of an integrated circuit.

These and other aspects of the present disclosure are disclosed in the following detailed description of the implementations, the appended claims and the accompanying figures.

BRIEF DESCRIPTION OF THE DRAWINGS

The description herein makes reference to the accompanying drawings wherein like reference numerals refer to like parts throughout the several views.

DETAILED DESCRIPTION

A reference image may be simulated for inspecting a scanned image of a manufactured integrated circuit (IC) device on a wafer for detection of defects. The scanned image may be produced by a scanning electron-beam microscope (SEM). SEM images of IC device features typically consist of curved corners and edges instead of sharp corners and straight edges, making measurements inaccurate. Additionally, SEM images may include noise that interferes with accurately determining IC device edges. In order to obtain an accurate contour pattern for the actual IC device, the data-based wafer image may be generated based on the design data used to fabricate the IC device. The design data may include target polygon information, which may be rendered and transformed into a data-based wafer image having ideal contours for the IC devices. An algorithm may use the data-based wafer image as a guide to determine actual edges for the IC devices, which may then be more accurately measured for finding defects.

Figure 1:
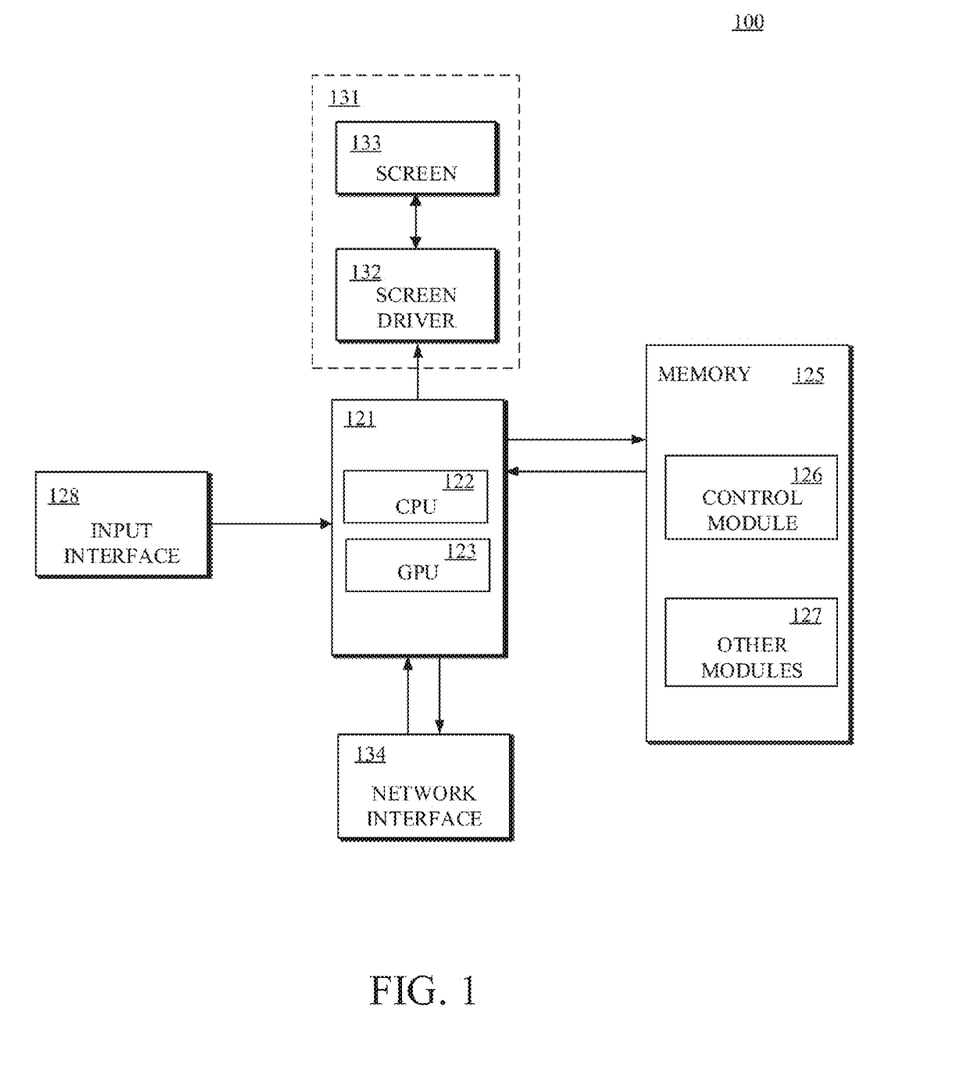
FIG. 1 is a block diagram of a computing device for reference image contour generation in accordance with implementations of the present disclosure.

FIG. 1 is a block diagram of an example computing device 100 for performing image contour generation in accordance with this disclosure. Computing device 100 may include a microcontroller 121, a memory unit 125 (e.g., RAM or flash memory), an input interface 128, a network interface 134, and an optional display 131.

Microcontroller 121 may include a central processing unit (CPU) 122 and a graphical processing unit (GPU) 123. The GPU 123 may provide additional graphical processing capability for pattern rendering, optical mask simulation, resist simulations, and thresholding processes. CPU 122, GPU 123 or both may access and manipulate data in memory unit 125.

Memory unit 125 may store various modules including control module 126 or other modules 127. Memory 125 is shown coupled to microprocessor 121 which may execute the various modules. When the control module 126 and other modules 127 are executed, a set of algorithms, processes, or steps may be run for realizing the functions of global image based optimization, global edge based optimization and local edge based optimization of the mask generation in accordance with this disclosure. Memory unit 125 may be implemented as Random Access Memory (RAM), or any suitable non-permanent storage device that is used as memory. Memory unit 125 can include executable instructions and data for immediate access by CPU 122, GPU 123 or both. Memory unit 125 may include one or more DRAM modules such as DDR SDRAM. Alternatively, memory 125 can include another type of device, or multiple devices, capable of storing data for processing by CPU 122/GPU 123 now-existing or hereafter developed. The CPU 122/GPU 123 may utilize a cache as a form of localized fast memory for operating on data and instructions.

Network interface 134 may be used for communication with other computing devices to send and received data and control signals. For example, network interface 134 may be connected to a scanning device (not shown) to receive image scans of dies formed on a wafer for inspection and measurements of die features, and may send scanned images to CPU 122/GPU 123 for processing and image contour generation. As another example, remote control instructions may be received for remote control of computing device 100 or other computing devices in the network via a designated medium, such as a data bus or Ethernet link.

Input interface 128 may be an interface, such as a keyboard or touch screen, which enables a user to enter commands or provide parameters to the computing device 100 related to the optical mask generation in accordance with this disclosure. Parameters or other control instructions may be loaded into memory 125 and stored in the control module 126.

Display 131 may include a screen driver 132 and a display screen 133 used for displaying various stages of the image contour generation, allowing a user to view the progress and make modifications as needed via input interface 128. Screen driver 132 is coupled to microcontroller 121 and may receive instructions therefrom to drive display screen 133. In an aspect, display screen 133 may display a generated mask image prior to an optimization process, during interim stages of an optimization process, after an optimization process, or a combination thereof. Display screen 133 enables a user, such as a microchip fabrication manager, to assess current status of the mask generation process.

The computing device 100 is an example, and a computing device may have an additional number of microcontrollers, CPUs, GPUs, or memory units for performing the optical mask generation of this disclosure. Other aspects of the computing device 100 are also possible. For example, one or more additional computing devices may operate as a network. Some or all of the techniques described herein may operate on such a network.

Figure 2:
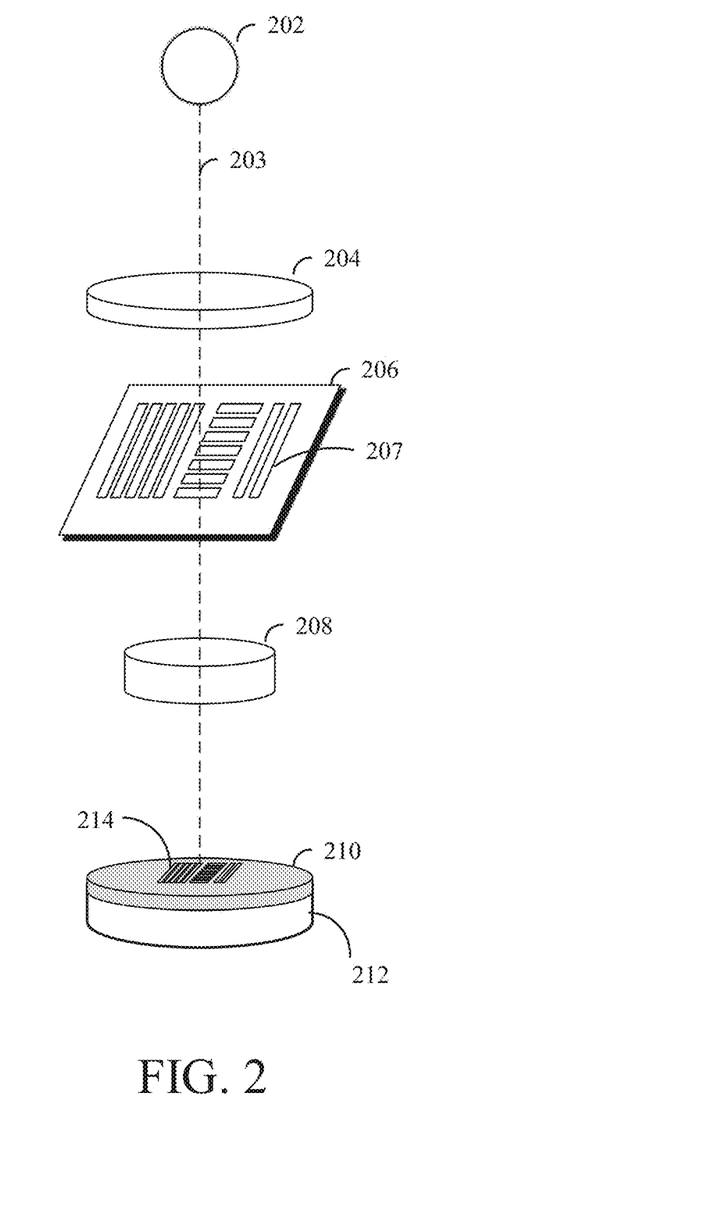
FIG. 2 is a diagram of a photolithographic system for fabricating IC devices on a wafer in accordance with implementations of the present disclosure.

FIG. 2 is a diagram of a photolithographic system for fabricating IC devices on a wafer in accordance with implementations of the present disclosure, which may include photo energy source 202, photo energy beam 203, illumination lens 204, mask 206, projection lens 208, photoresist layer 210, wafer 212, or a combination thereof. Photo energy beam 203 may be in the form of light energy, such as ultraviolet or visible light spectrum, or electron beam energy, projected from photo energy source 202. Photo energy beam 203 may be projected through an optics system, which may include an illumination lens 204, a projection lens 208, or both, for focusing the energy to print an image onto wafer 212. For example, projection lens 208 may focus the photo energy beam 203 to form a projected image 214 on the photoresist layer 210. A photolithographic mask 206 may be fabricated based on an IC design image, having a mask pattern 207 of polygons that correspond with IC device features. Different masks may be applied in an iterative manner to print respective layers onto the wafer during the IC fabrication process. The mask pattern 207 may allow the energy to pass through selected areas for projection as a positive image or a negative image on the wafer 212. Photoresist layer 210 may be applied as a polymer or resin film on the surface of wafer 212, and may have photosensitive material properties that react to the photo energy beam 203. For example, projected image 214 on photoresist layer 210 may transform the photoresist layer 210 in a way that forms a printed image on the surface of wafer 212. The printed image is a layer of transformed material on the surface of wafer 212 and may have a pattern that resists etching or allows etching of wafer material where photo energy 203 was masked, depending on whether the mask pattern is a positive image or negative image. A subsequent etching process of the current layer being fabricated may be performed on the wafer following the masking and photo exposure process. The masking and photo exposure of wafer 212 may be repeated as necessary for each layer of features for the IC device in between etching process passes on the wafer 212.

Characteristics of the optical elements, photo energy source 202, illumination lens 204, projection lens 208, and mask 206, have an effect on the printed image on wafer 212. For example, diffraction of photo energy 203 may cause the printed image on wafer 212 to deviate from the original design polygons of the IC device to be fabricated. Characteristics of the material for photoresist layer 210 may also effect the resultant image pattern on wafer 212, causing deviation from the original design polygons.

Figure 3:
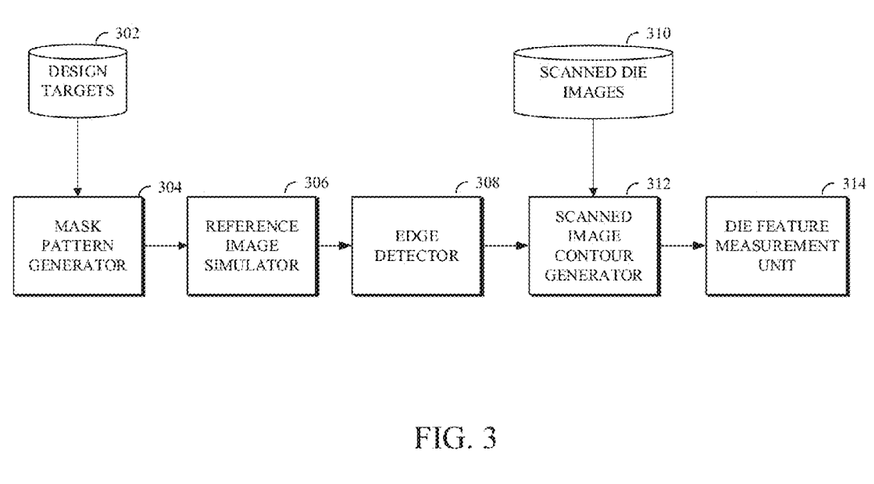
FIG. 3 is a flow diagram for image contour generation in accordance with implementations of the present disclosure.

FIG. 3 is a flow diagram for image contour generation in accordance with implementations of the present disclosure, which may include a database of design targets 302, mask pattern generator 304, reference image simulator 306, edge detector 308, scanned die images 310, scanned image contour detector 312, die feature measurement unit 314, or a combination thereof.

Design targets 302 may be stored in a design database in the form of mathematical descriptions of geometric features to be printed on wafer as a pattern for IC devices. For example, design targets 302 may be characterized as polygons of various shapes, dimensions, properties, and interconnective relationships. The polygons may be organized into pattern cells. Each polygon may be described in the design database by coordinates of corners, and directions of lines connecting the corners. Design targets 302 may be provided in the form of a design layout for each IC device to be fabricated on the wafer. Design targets 302 may consist of complex and intricate elements having linear pathways and multilayer connection points to be formed of various conductive, non-conductive and semiconductive materials. Individual elements and gaps between elements may be required to have a nanometer resolution, such as 32 nm or below for example. The design database of design targets 302 may be implemented using an Open Artwork System Interchange Standard (OASIS) application, for example.

Mask pattern generator 304 may graphically render design targets 302 into a mask pattern for a photomask, such as photomask 206 shown in FIG. 2. In an aspect, the polygons may be rendered onto a grid having a selectable resolution, where the polygon corners do not necessarily align with grid corners. The mask pattern may be rendered as a grayscale image or as a binary color image. For example, the design target polygons may be drawn and like features may be distinguished from dissimilar features by a different grayscale shading. As another example, all design target polygons may be drawn and filled with a single color for a binary color image.

Reference image simulator 306 may apply a photolithographic simulation, a photoresist simulation, or a combination of both to the mask pattern to generate a reference image based on the design targets 302. In an aspect, reference image simulator 306 may apply a photolithographic simulation to obtain an ideal, noise-free optical image predicted for the wafer. For example, an optical model may be generated to predict the effect of one or more lenses on the photo energy beam as it passes through the photomask and onto the resist layer on the wafer surface. From the optical model simulation, a data-based aerial image may be generated, representing the photo energy distribution in space just above the surface of the photo resist layer. For example, referring to FIG. 2, the focused image of photo energy beam 203 may be predicted as an aerial image that would appear just above the projected image 214 on photo resist layer 210.

In an aspect, reference image simulator 306 may apply a photoresist simulation, such as a photoresist model having 2D or 3D profile characteristics, for predicting the chemical reaction of a resist material to the photo energy as passes through the resist layer and prints the image on the wafer surface. For example, referring to FIG. 2, the photo energy beam 203 passing through photoresist layer 210 may react to the profile and material characteristics of the photoresist layer material as it is projected onto the surface of wafer 212. The resist simulation may predict this reaction, and generate a reference image based on the prediction.

Edge detector 308 may perform a threshold function to the reference image to generate a reference image contour pattern. For example, an algorithm may identify sharp brightness changes in the wafer image to detect edges in the image, which may be in the form of straight or curved line segments.

Scanned die images 310 obtained by scanning fabricated dies on the wafer may be stored in a memory, such as memory 125 shown in FIG. 1, and accessed for processing in accordance with this disclosure.

Scanned image contour detector 312 may use the reference image contour pattern to guide an inspection algorithm that detects features in the die images 310 to generate a scanned image contour pattern. The inspection algorithm may have functions that limit detection of features in the die images 310 to only areas where reference image edges exist, which can improve efficiency of the scanned image contour pattern generation. Consequently, false lines that may be produced in the scanned image contour pattern due to scanning noise can be omitted.

In an aspect, image contour detector 312 may apply a scan-based die-to-database defect detection algorithm that compares lines of the scanned image contour pattern to the reference image contour pattern. For example, the algorithm may divide the scanned image contour pattern and the reference image contour pattern into corresponding sectors. Within each sector, a comparison may be made between the two patterns. The comparison may be performed on a per-line basis or a per-object basis. Defects on the die may be detected where there is a contour line on the scanned image contour pattern that does not coincide with the reference image contour pattern.

Die feature measurement unit 314 may perform measurements of lines and clearances between die elements, such as integrated circuit features, using the scanned image contour pattern. For example, lines corresponding to an IC element may be measured to determine if the fabricated element is within specification tolerances.

Figure 4:
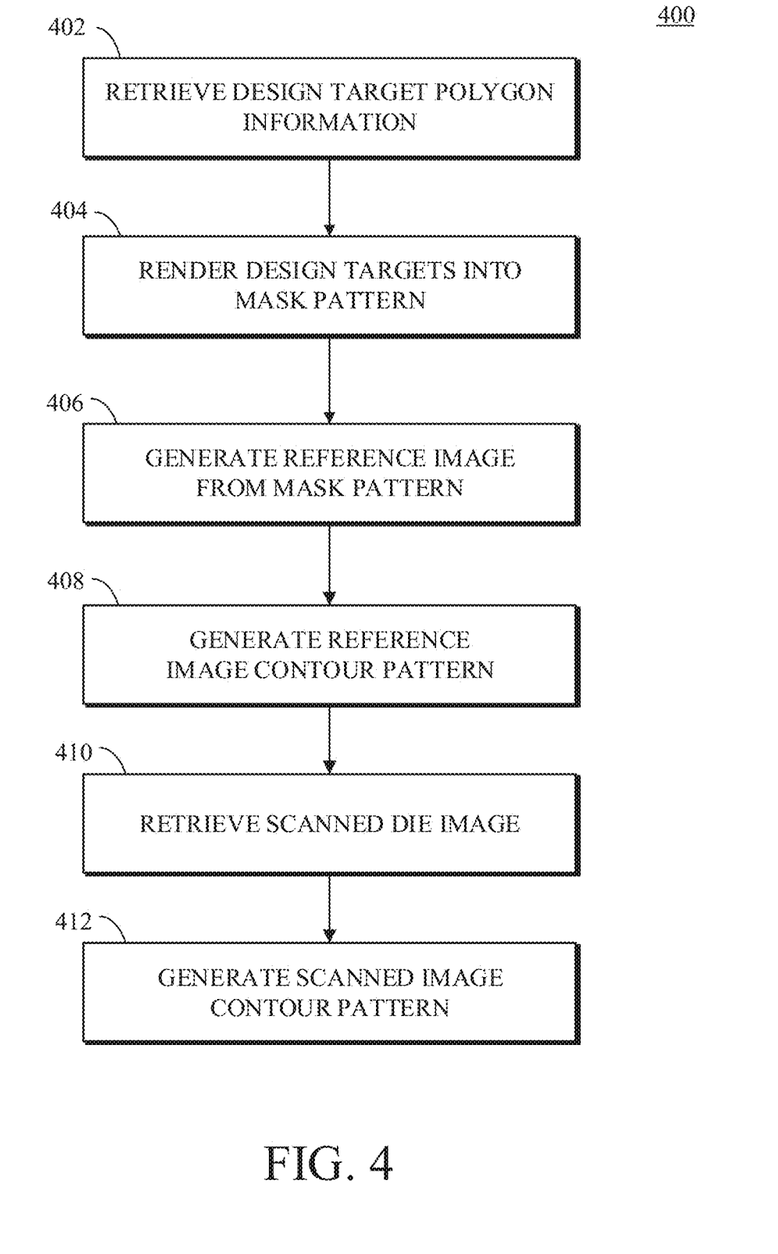
FIG. 4 is a method flow diagram for image contour generation in accordance with implementations of the present disclosure.

FIG. 4 is a method flow diagram for reference image contour generation in accordance with implementations of the present disclosure. In an aspect, reference image contour generation may include retrieving design target polygon information at 402, rendering design targets into a mask pattern at 404, generating a reference image 406, generating a reference image contour pattern 408, retrieving scanned die image 410, generating scanned image contour pattern 412, or a combination thereof.

In an aspect, design target polygon information may be retrieved at 402. For example, design target polygons may be stored in a database as geometric information and accessed for generating a reference image.

In an aspect, design target polygons may be rendered into a mask pattern at 404. For example, a masking algorithm may generate a rendering of the target polygons as a function of the design target polygon information.

In aspect, a reference image may be generated at 406 based on the mask pattern. For example, a photolithographic algorithm may generate an image as a function of optical characteristics, photoresist characteristics, or combination of both, which represents an expected projection of design target polygons onto the wafer using the mask pattern.

In an aspect, a reference image contour pattern may be generated at 408. For example, a thresholding algorithm may determine edges of the reference image, and generate contour lines where edges are located to produce a contour pattern for the reference image.

In an aspect, a scanned die image may be retrieved at 410. For example, an SEM image of a die fabricated on the wafer may be retrieved from a memory. SEM images of the wafer may be retrieved in portions as needed.

In an aspect, a scanned image contour pattern may be generated at 412. For example, the reference image contour pattern at 408 may be used as a guide for assisted inspection of corresponding portions of scanned die image retrieved at 410, to produce a contour pattern for the scanned image, since the scanned image may not have straight lines and sharp corners detectible by simple inspection.

Figure 5:
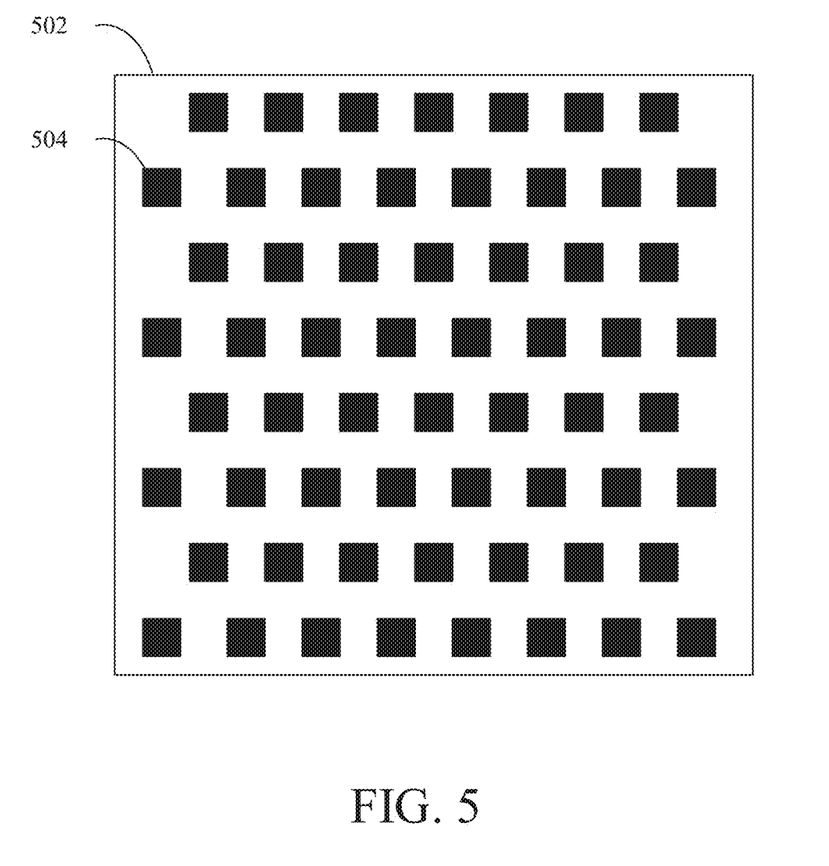
FIG. 5 shows an example of a rendered mask pattern in accordance with implementations of the present disclosure.

FIG. 5 shows an example of a rendered mask pattern in accordance with implementations of the present disclosure. In an aspect, a mask pattern, such as pattern 502, is graphically rendered from the target polygon information in the design database. Mask pattern 502 may include polygons 504 corresponding to the target polygon information.

Figure 6:
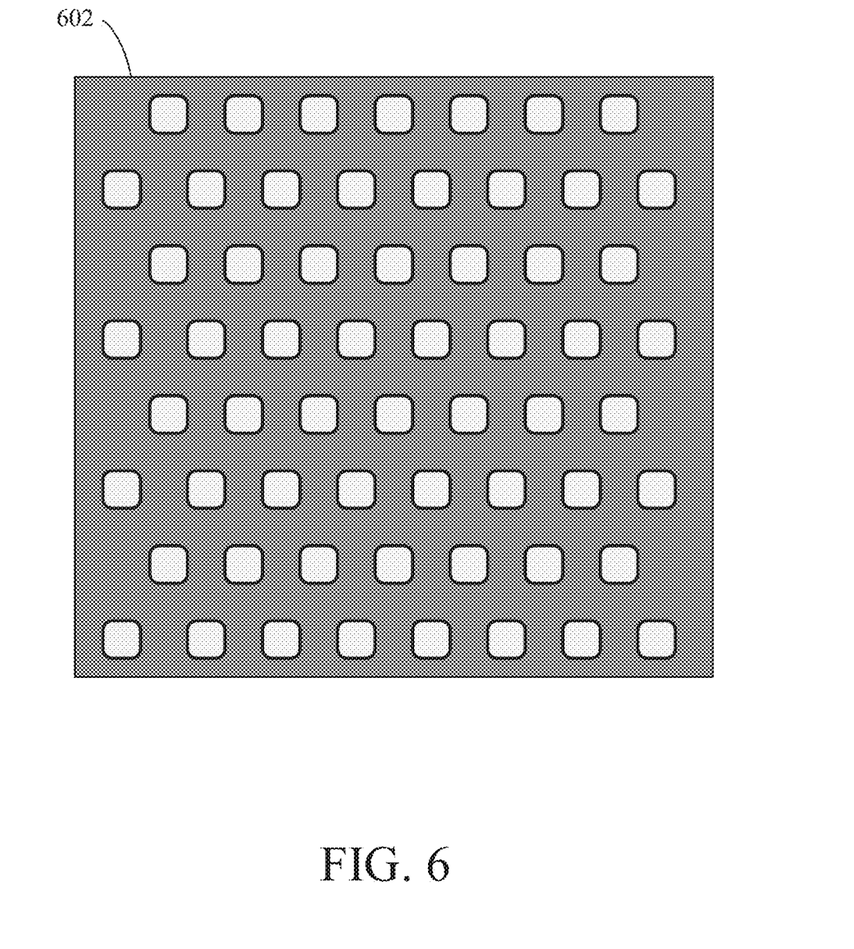
FIG. 6 shows an example of a simulated wafer image reproduction based on the rendered mask pattern shown in FIG. 5 in accordance with implementations of the present disclosure.

FIG. 6 shows an example of a simulated wafer image reproduction based on the rendered mask pattern 502 shown in FIG. 5 in accordance with implementations of the present disclosure. In an aspect, a lithographic algorithm simulates a pattern image reproduction, such as simulated pattern image 602, as a function of a modeled photolithographic and photoresist arrangement for the IC fabrication on the wafer.

Figure 7:
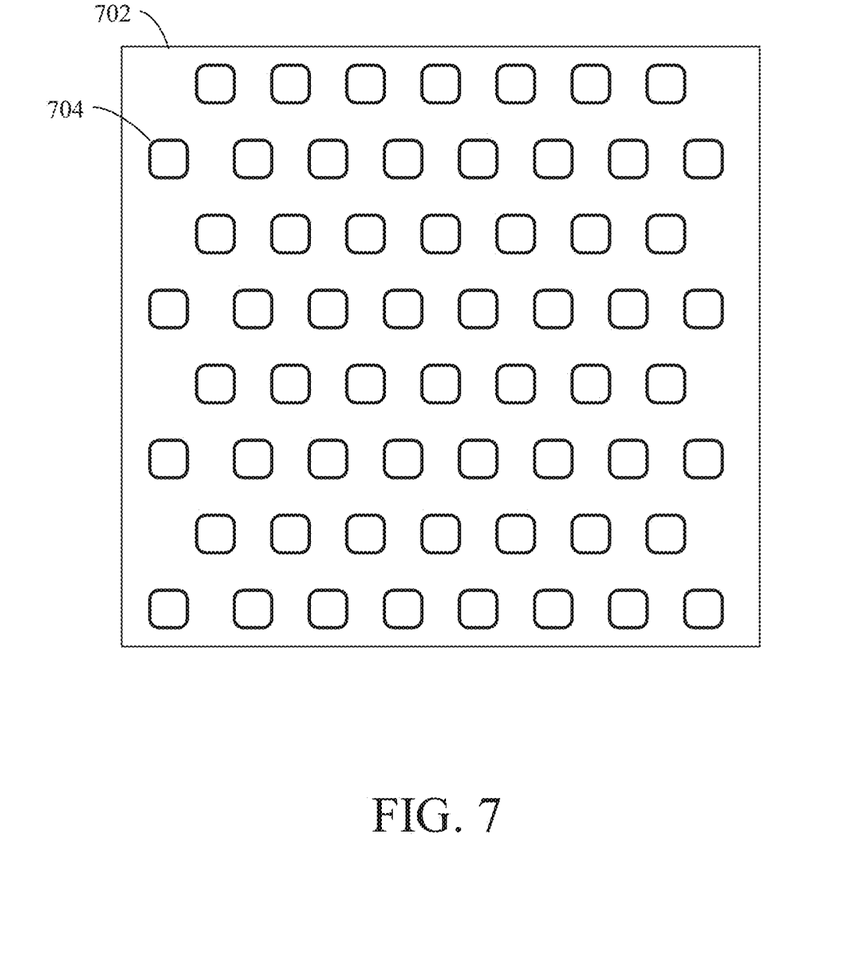
FIG. 7 shows an example of a reference image contour pattern based on the simulated wafer image shown in FIG. 6 in accordance with implementations of the present disclosure.

FIG. 7 shows an example of a reference image contour pattern based on the simulated wafer image shown in FIG. 6 in accordance with implementations of the present disclosure. In aspect, a reference image contour pattern, such as pattern 702, may be generated as a function of thresholding the simulated wafer image 602. For example, a thresholding algorithm may isolate edges based on brightness changes in the simulated wafer image 602, and may generate contour lines 704 where the detected edges are located. Contour lines 704 may represent expected location and arrangement of target polygons on the wafer resulting from lithographic projection.

Figure 8:
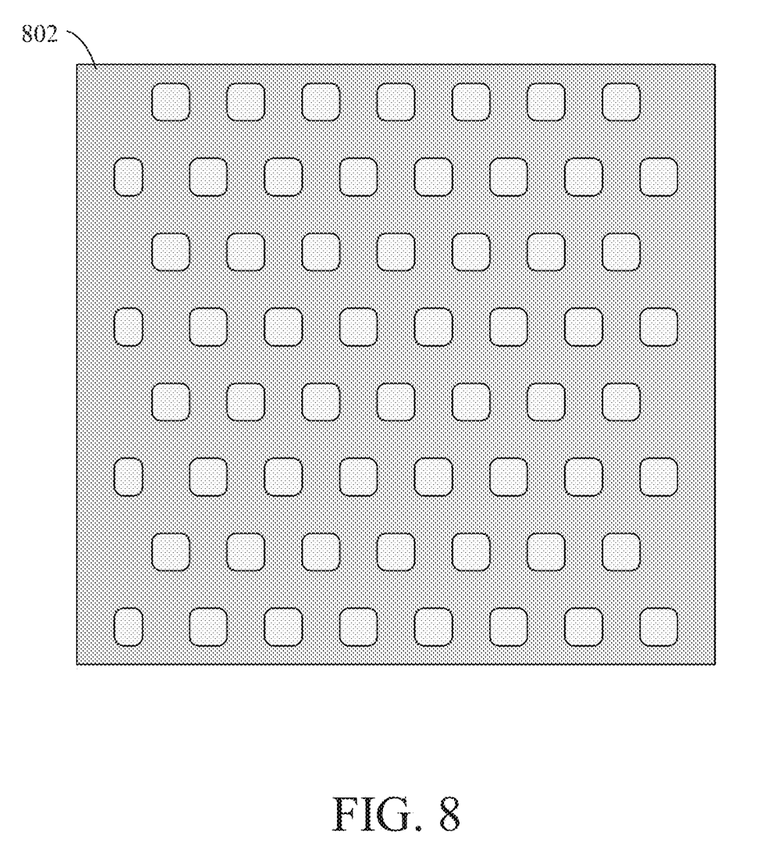
FIG. 8 shows an example of a scanned die image in accordance with implementations of the present disclosure.

FIG. 8 shows an example of a scanned die image in accordance with implementations of the present disclosure. In an aspect, a scanned die image, such as scanned image 802, produced by a scanning technique, such as a SEM image, may be retrieved from a memory.

Figure 9:
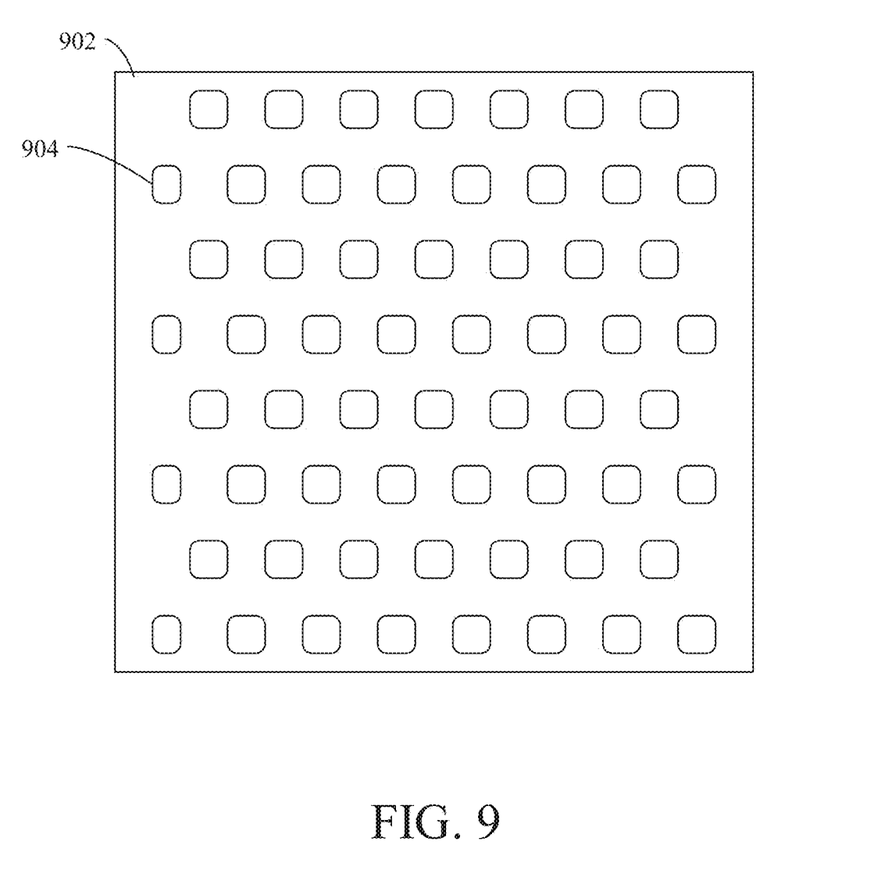
FIG. 9 shows an example of a scanned die image contour based on the reference image contour pattern shown in FIG. 7 and scanned die image shown in FIG. 8.

FIG. 9 shows an example of a scanned die image contour pattern based on the reference image contour pattern shown in FIG. 7 and the scanned image shown in FIG. 8. In an aspect, the reference image contour pattern 702, as shown in FIG. 7, may be used as a guide for an inspection pass of scanned image 802 for detecting the contour of scanned IC device elements 904 in image contour pattern 902.

Figure 10:
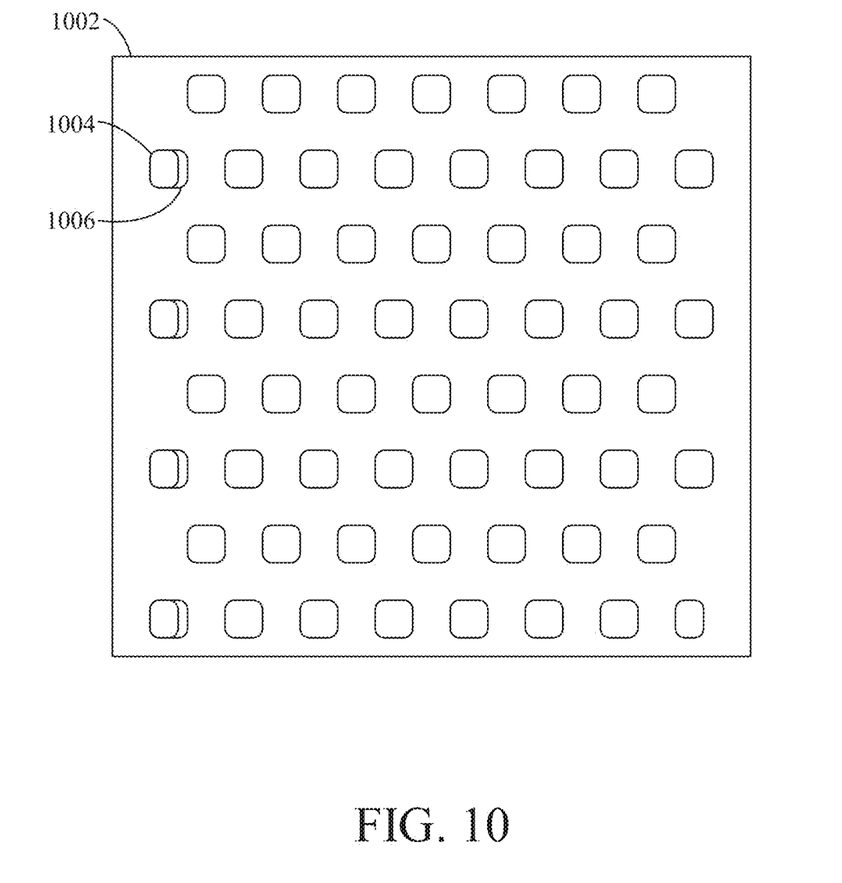
FIG. 10 shows an example of a comparison of the reference image contour pattern of FIG. 7 to the scanned die image contour of FIG. 9.

FIG. 10 is an example comparison of the reference image contour pattern of FIG. 7 to the scanned image contour pattern of FIG. 9. In an aspect, the reference image contour pattern 702 of FIG. 7 may be overlaid on the scanned image contour pattern 902 of FIG. 9 to generation comparison pattern 1002. Inspection of comparison pattern 1002 may reveal the areas that do not match, such as 1004/1006, as an indication of defects in the IC device fabrication on the wafer.

The implementations herein may be described in terms of functional block components and various processing steps. The disclosed processes and sequences may be performed alone or in any combination. Functional blocks may be realized by any number of hardware and/or software components that perform the specified functions. For example, the described implementations may employ various integrated circuit components, e.g., memory elements, processing elements, logic elements, look-up tables, and the like, which may carry out a variety of functions under the control of one or more microprocessors or other control devices. Similarly, where the elements of the described implementations are implemented using software programming or software elements the disclosure may be implemented with any programming or scripting language such as C, C++, Java, assembler, or the like, with the various algorithms being implemented with any combination of data structures, objects, processes, routines or other programming elements. Functional aspects may be implemented in algorithms that execute on one or more processors. Furthermore, the implementations of the disclosure could employ any number of conventional techniques for electronics configuration, signal processing and/or control, data processing and the like.

Aspects or portions of aspects of the above disclosure can take the form of a computer program product accessible from, for example, a computer-usable or computer-readable medium. A computer-usable or computer-readable medium can be any device that can, for example, tangibly contain, store, communicate, or transport a program or data structure for use by or in connection with any processor. The medium can be, for example, an electronic, magnetic, optical, electromagnetic, or a semiconductor device. Other suitable mediums are also available. Such computer-usable or computer-readable media can be referred to as non-transitory memory or media, and may include RAM or other volatile memory or storage devices that may change over time. A memory of an apparatus described herein, unless otherwise specified, does not have to be physically contained by the apparatus, but is one that can be accessed remotely by the apparatus, and does not have to be contiguous with other memory that might be physically contained by the apparatus.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. In other words, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an aspect" or "one aspect" throughout is not intended to mean the same implementation or aspect unless described as such.

The particular aspects shown and described herein are illustrative examples of the disclosure and are not intended to otherwise limit the scope of the disclosure in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. Many alternative or additional functional relationships, physical connections or logical connections may be present in a practical device.

The use of "including" or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The use of the terms "a" and "an" and "the" and similar referents in the context of describing the disclosure (especially in the context of the following claims) should be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Finally, the steps of all methods described herein are performable in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed.

The above-described implementations have been described in order to allow easy understanding of the present disclosure and do not limit the present disclosure. To the contrary, the disclosure is intended to cover various modifications and equivalent arrangements included within the scope of the appended claims, which scope is to be accorded the broadest interpretation so as to encompass all such modifications and equivalent structure as is permitted under the law.

What is claimed is:

1. A method for reference image contour generation, comprising:
generating, by a processor in response to instructions stored on a non-transitory computer readable medium, a scanned image contour pattern, wherein generating the scanned image contour pattern comprises:
generating a mask pattern based on design target information;
generating a reference image based on a simulation of photolithographic effects on the mask pattern;
generating a reference image contour pattern based on edge detection in the reference image; and
generating the scanned image contour pattern as a function of the reference image contour pattern and a scanned image of an integrated circuit by:
dividing the scanned image contour pattern and the reference image contour pattern into corresponding sectors; and
comparing the scanned image contour pattern to the reference image contour pattern within each sector.

2. The method of claim 1, wherein the simulation of photolithographic effects is a function of an optical model based on characteristics of a lens used to fabricate the integrated circuit.

3. The method of claim 1, wherein the simulation of photolithographic effects is a function of an optical model based on characteristics of a photomask used to fabricate the integrated circuit.

4. The method of claim 1, further comprising:
generating a simulation of photoresist effects that are a function of a photoresist model based on characteristics of a photoresist layer used to fabricate the integrated circuit; and
generating the reference image based on a combination of the simulation of photolithographic effects and the simulation of photoresist effects.

5. The method of claim 1, further comprising:
detecting a defect in the integrated circuit in an area where the scanned image contour pattern does not coincide with a corresponding area of the reference image contour pattern.

6. The method of claim 1, wherein the comparing is performed on a per-line basis.

7. The method of claim 1, wherein the comparing is performed on a per-object basis.

8. The method of claim 1, further comprising:
performing measurements of integrated circuit features identified in the scanned image contour pattern.

9. The method of claim 1, further comprising retrieving the scanned image from a memory.

10. A method for reference image contour generation, comprising:
generating, by a processor in response to instructions stored on a non-transitory computer readable medium, a scanned image contour pattern, wherein generating the scanned image contour pattern comprises:
generating a mask pattern based on design target information;
generating a reference image based on a simulation of photoresist effects on the mask pattern;
generating a reference image contour pattern based on edge detection in the reference image; and
generating the scanned image contour pattern as a function of the reference image contour pattern and a scanned image of an integrated circuit by:
dividing the scanned image contour pattern and the reference image contour pattern into corresponding sectors; and
comparing the scanned image contour pattern to the reference image contour pattern within each sector.

11. The method of claim 10, wherein the simulation of photoresist effects are a function of a photoresist model based on characteristics of a photoresist layer used to fabricate the integrated circuit.

12. The method of claim 10, further comprising:
detecting a defect in the integrated circuit in an area where the scanned image contour pattern does not coincide with a corresponding area of the reference image contour pattern.

13. The method of claim 10, wherein the comparing is performed on a per-line basis.

14. The method of claim 10, wherein the comparing is performed on a per-object basis.

15. The method of claim 10, further comprising:
performing measurements of integrated circuit features identified in the scanned image contour pattern.

16. An apparatus, comprising: a memory; and
a processor configured to execute instructions stored in the memory to:
generate a mask pattern based on design target information;
generate a reference image based on a simulation of photolithographic effects on the mask pattern;
generate a reference image contour pattern based on edge detection in the reference image; and
generate a scanned image contour pattern as a function of the reference image contour pattern and a scanned image of an integrated circuit by:
dividing the scanned image contour pattern and the reference image contour pattern into corresponding sectors; and
comparing the scanned image contour pattern to the reference image contour pattern within each sector.

17. The apparatus of claim 16, wherein the processor is further configured to execute instructions stored in the memory to:
generate a simulation of photoresist effects that are a function of a photoresist model based on characteristics of a photoresist layer used to fabricate the integrated circuit; and
generate the reference image based on a combination of the simulation of photolithographic effects and the simulation of photoresist effects.

18. The apparatus of claim 16, wherein the processor is further configured to execute instructions stored in the memory to:

detect a defect in the integrated circuit in an area where the scanned image contour pattern does not coincide with a corresponding area of the reference image contour pattern.

\* \* \* \* \*